United States Patent [19]

Otsuka et al.

[11] Patent Number: 5,308,433
[45] Date of Patent: May 3, 1994

[54] APPARATUS AND METHOD FOR VAPOR GROWTH

[75] Inventors: Nobuyuki Otsuka; Yasushi Matsui, both of Osaka, Japan

[73] Assignee: Matsushita Electric Industrial Co., Ltd., Osaka, Japan

[21] Appl. No.: 865,426

[22] Filed: Apr. 9, 1992

[30] Foreign Application Priority Data

Apr. 11, 1991 [JP] Japan .................. 3-078883

[51] Int. Cl.$^5$ .............................. C30B 25/14
[52] U.S. Cl. ...................... 117/93; 117/954
[58] Field of Search ........... 158/610, 613, 614, 611; 437/87, 110

[56] References Cited

U.S. PATENT DOCUMENTS

| | | | |
|---|---|---|---|
| 3,930,908 | 1/1976 | Jolly | 156/613 |
| 4,066,481 | 1/1978 | Manasevit et al. | 156/613 |
| 4,368,098 | 1/1983 | Manasevit | 156/613 |
| 4,588,451 | 5/1986 | Vernon | 156/613 |

Primary Examiner—Robert Kunemund
Attorney, Agent, or Firm—Lowe, Price, LeBlanc & Becker

[57] ABSTRACT

Herein disclosed is a vapor growth system, in which the number of dummy lines is reduced to decrease the number of lines led into a valve system, thereby enabling thin film growth having a good interfacial steepleness. The system comprising gas supplying lines A70, B71 and C72, which are made up of AsH$_3$ process gas lines A62, B65, C68 and and balance lines A61, B64 and C67, respectively. The balance lines A61, B64 and C$_{67}$ contributes equalization of products of the viscosity and the flow rate in the gas supplying lines A70, B71 and C72, and the dummy line 60. Only when AsH$_3$ (A), AsH$_3$ (B) and AsH$_3$ gases are not fed upon formation of the film growth, the dummy line 60 is connected to the main line. Whereby, the system is free from pressure fluctuation of the gas in the main line, with an arrangement of even a single dummy line.

1 Claim, 8 Drawing Sheets

| GAS | AsH3(A) 70 | | AsH3(B) 71 | | AsH3(C) 72 | | DUMMY 60 | | NUMBER OF SWITCHED VALVE |
|---|---|---|---|---|---|---|---|---|---|
| VALVE | 6 | 7 | 10 | 11 | 14 | 15 | 4 | 5 | |
| | CONDITION | | CONDITION | | CONDITION | | CONDITION | | |
| TEMPERATURE RISING | X / V | O | X / V | O | X / V | O | O / V | X | |
| WAVEGUIDE LAYER 41 | X / V | O | X / V | O | X / V | O | X / V | O | 4 |
| BARRIER LAYER 42 | [O] / M | [X] | X / V | O | [O] / M | [X] | X / V | O | 4 |
| WELL LAYER 43 | X / V | O | [O] / M | [X] | X / V | O | X / V | O | 4 |
| CLADDING LAYER 44 | X / V | O | X / V | O | X / V | O | O / M | [X] | 4 |

REPEATED 3 TO 10 TIMES

M : CONNECTED TO MAIN LINE
V : CONNECTED TO VENT LINE
X : CLOSED
O : OPENED

FIG. 8 PRIOR ART

| GAS | AsH3(A) 62 | | AsH3(B) 65 | | AsH3(C) 68 | | DUMMY 60 | | DUMMY 63 | | DUMMY 66 | | NUMBER OF SWITCHED VALVE |
|---|---|---|---|---|---|---|---|---|---|---|---|---|---|
| | CONDITION | | CONDITION | | CONDITION | | CONDITION | | CONDITION | | CONDITION | | |
| VALVE | 6 | 7 | 10 | 11 | 14 | 15 | 4 | 5 | 8 | 9 | 12 | 13 | |
| TEMPERATURE RISING | X | O | X | O | X | O | O | X | O | X | O | X | |
| WAVEGUIDE LAYER 41 | X | O | X | O | O | X | O | X | O | X | X | O | 4 |
| BARRIER LAYER 42 | O | X | O | X | X | X | X | O | X | X | O | X | |
| WELL LAYER 43 | X | O | O | X | X | X | O | X | O | X | X | X | 8 |
| CLADDING LAYER 44 | X | O | X | O | X | X | O | X | O | X | O | X | 4 |

Condition labels above columns: M M M / V M V / V M M / M V M / M M V / M V M

REPEATED 3 TO 10 TIMES

M : CONNECTED TO MAIN VALVE
V : CONNECTED TO VENT VALVE
X : CLOSED
O : OPENED

APPARATUS AND METHOD FOR VAPOR GROWTH

BACKGROUND OF THE INVENTION

1. Field of the Invention

The present invention relates to a system for vapor growth and/or deposition and a method using the same, particularly to such the system provided with a gas supply-exhaust line system for supplying material gases and the like to a growth chamber and venting unnecessary gases therefrom, and a vapor growth and/or deposition method using the system.

More specifically, the present invention concerns to a vapor growth and/or deposition system, in which a single dummy line is arranged to a plurality of process gas lines to reduce the number of valve switching by half upon forming accumulated layers made from materials of different compositions so that pressure fluctuation in a main line due to the valve switching may be suppressed, thereby providing a formation of a super thin film having a stable crystallinity and an excellent interfacial steepleness, besides providing a low-cost, simplified structure by reducing the number of expensive block valves, and a vapor growth method using such the system.

2. Prior Art

Figure 5:
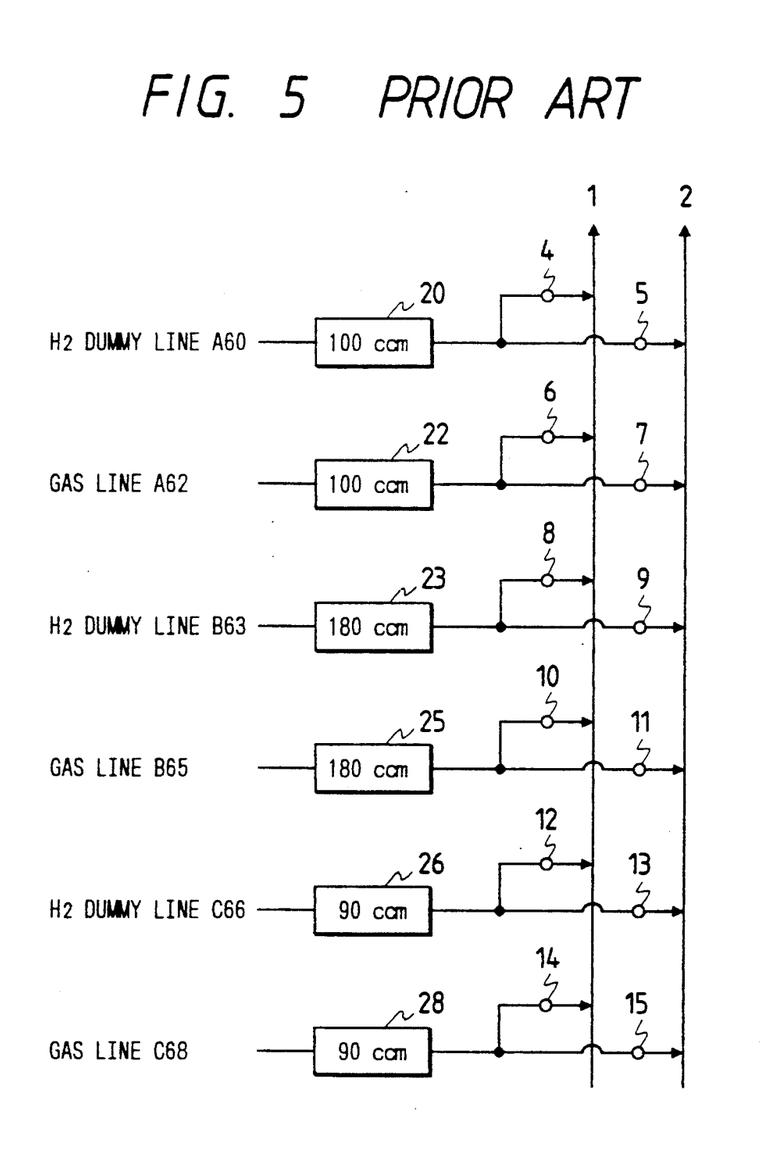
FIG. 5 is a schematic diagram showing a part of a structure of a vent-supply line system for gases in a conventional vapor phase growth system.

A conventional crystal growth system has a structure shown in FIG. 5 [refer to Journal of Crystal Growth, 93,353 (1988), Suematsu, et. al. ]. Here, reference numeral 1 denotes a main line for supplying material gases to a crystal growth chamber. Numeral 2 denotes a vent line for discharging gases unnecessary for the crystal growth. Numerals 4, 6, 8, 10, 12 and 14 are air valves for controlling flows of the gases to the main line 1. Numerals 5, 7, 9, 11, 13 and 15 are another air valves for controlling flows of the gases to the vent line 2. Numerals 20, 22, 23, 25, 26 and 28 are mass flow controllers for controlling gas flow rates to adjust them to 100, 100, 180, 180, 90 and 90 ccm, respectively. Numeral 62 denotes a gas line A as a process gas line for supplying a process gas A. Numeral 60 is a dummy line A for supplying a hydrogen gas with a flow rate equal to that in the gas line A. Numeral 65 is a gas line B which is a process gas line supplying a process gas B. Numeral 63 is a dummy line for supplying a hydrogen gas with a flow rate equal to that in the gas line B. Numeral 68 is a gas line C which is a process gas line supplying a process gas C. Numeral 66 is a dummy line C for supplying a hydrogen gas with a flow rate equal to that in the gas line C.

As shown in FIG. 5, the gas lines, A, B and C, and the dummy lines A, B and C are communicated with the the main line 1 and the vent line 2 via the valves 4 to 15, respectively.

Now will be described an operation of the conventional vapor phase crystal growth system having such the structure set forth above. When the process gas A is not required for the crystal growth, the valve 6 of the gas line A is closed, while the valve 7 is opened. As a result, the process gas A is fed to the vent line so as not to contribute to the crystal growth. Meanwhile, the valve 4 of the dummy line A running the gas of which flow rate is controlled to be equal to that in the gas line A is opened, while the valve 5 is closed. Therefore, the hydrogen gas which has the same value of a flow rate as the process gas A is fed to the main line 1. Now, if the process gas A is desired to be fed to the main line, the gas line A has to connected to the main line 1 and the gas line B has to connected to the vent line 2 at the same time. So, the valves 4 and 7 are closed and the valves 5 and 6 are opened, simultaneously.

In consequence, a total gas flow rate of the gas supplied to the main line 1 is kept constant for a reason why the flow rate of the gas supplied to the main and vent lines 1 and 2 should not be varied, thereby suppressing fluctuation of the gas pressure in the main line 1 induced by the fluctuation of the flow rate. A stable pressure of the gas in the main line 1 becomes extremely important when a flow rate of the supplied process gas is very small.

In a gas supplying system failing in appropriate adjustment of the flow rates of gases supplied from dummy lines, a difference in gas flow rate between a process gas line and a dummy line causes a difference in gas pressure between the process gas line and a main line, when a process gas line having a smaller flow rate than the dummy gas line is connected to the main line. This leads to backflow of the gas from the main line to the process gas line when the process gas line has a small flow rate. In particular, it is necessary to switch the gas flows every few seconds, when an extremely thin crystal such as a quantum well structure is produced. In this occasion, such the backflow of the gas causes a gap of the timings between the valve switching and the actually supplied gas flow. This finally results in fluctuation in every crystal composition on the crystal interface (Hereinafter, this condition will be expressed as an inferior steepleness of a crystal, because of a slow switching of the gas.). A dummy line having a flow rate equal to that in a process line is required to obtain a thin crystal film excellent in steepleness, as described above.

On the other hand, the backflow of a gas is attributed to a small flow rate of the gas. So, there has been adopted a method, in which a process gas line having a small flow rate is connected to a line for a hydrogen diluent, as shown in FIG. 6, in order to keep the flow rate of the gas at a predetermined level or more.

Figure 6:
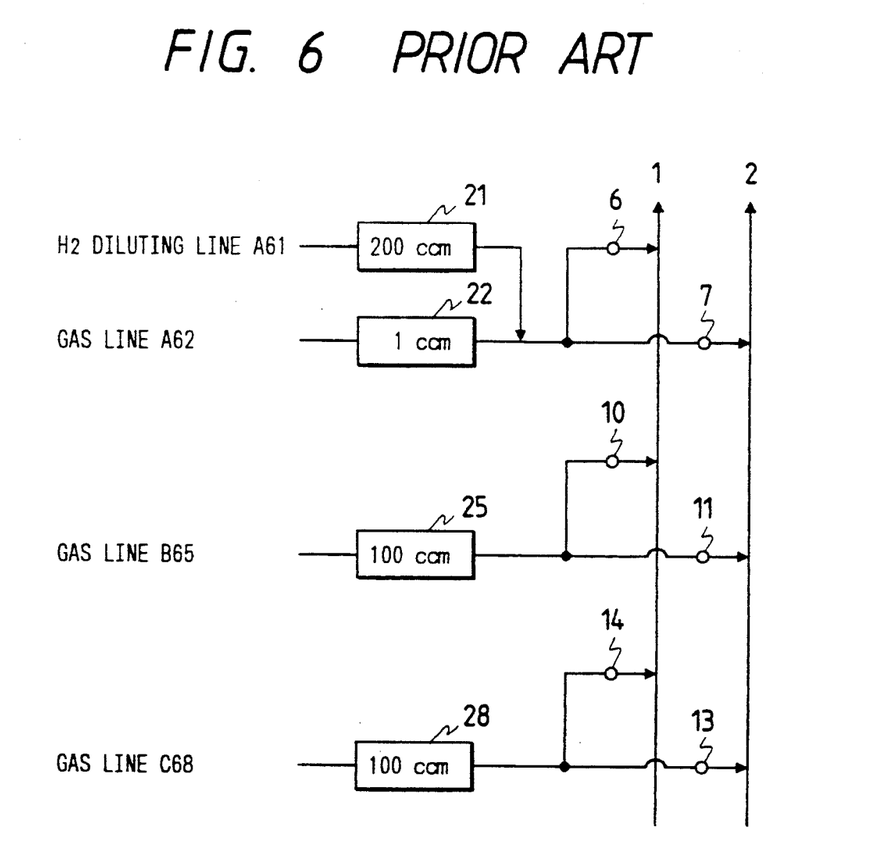
FIG. 6 is a schematic diagram showing a part of a structure of a vent-supply line system for gases in another conventional vapor phase growth system.

In FIG. 6, numeral 1 also denotes a main line supplying material gases to a crystal growth chamber, 2 a vent line exhausting the gases unnecessary for the crystal growth. Numerals 6, 10 and 14 are air valves for controlling the gas flow to the main line 1, while 7, 11 and 15 are another air valves for controlling the gas flow to the vent line 2. Numerals 21, 22, 25 and 28 are mass flow controllers for controlling the gas flows to 200, i, 100 and 200 ccm, respectively. Numeral 61 is a diluting line A feeding a hydrogen gas for diluting the process gas A in the line A. Numeral 65 denotes a gas line B supplying a process gas B and 68 is another gas line C feeding a process gas C.

Hereinafter will be described an operation of an another conventional vapor phase crystal growth system having the structure shown in FIG. 6. When the process gas A is not required for the crystal growth, the valve 6 of the gas line A62 is closed, while the valve 7 of the same is in an open state. The process gas A is, as a result, fed to the vent line so as not to contribute to the crystal growth. If a gas of a great flow rate such as arsine as a constituent gas is switched to be supplied to the main line 1, the gas line A of a very small flow rate is directly subjected to the influence of the pressure increase in the main line due to the switching of the arsine gas so that the gas running in the main line 1 backflows into the gas line A62. To prevent this backflow of the gas from the main line, it is necessary to increase a flow rate in the gas line A62. For this purpose, a hydrogen gas is fed to the gas line A for dilution in order to increase the flow rate of the process gas A, so that the backflow of the gas due to the pressure increase may be suppressed. If the gas A is required for the crystal growth, the gas line A is connected to the main line. Accordingly, the valve 7 is closed and the valve 6 is opened, simultaneously.

Although a slight pressure fluctuation in the main line caused by the valve switching occurs, this will not cause a backflow of the gas running in the main line to the gas line A. This, however, causes a flow rate fluctuation of the gas running in the main line. No dummy line is disposed because such the gas line requiring a diluting gas line has a small flow rate.

Recently, a block valve system is used as integrated valves. The block valve system is a compact integration of a plurality of valves positioned as close to the main valve as possible to largely reduce a dead volume in the main line in the block valve system, thereby suppressing a change of the gas compositions because of stagnation of the gas therein. An interfacial steepness is attained by a rapid change of the gas compositions. For this reason, the main line is required to have a dead volume as small as possible so as to prevent the stagnation of the gas.

The system having a structure shown in FIG. 5 requires the lines led to the block valve system, of which number is two times that of the process gas lines, since each of the process line requires a dummy line. That is, when the gas line A is switched over to the gas line B, the valves 4 to 11, 8 valves in total, must be switched so that slight difference in controllability of the valves occurs and this results in pressure fluctuation in the main line.

Moreover, there is a demand to decrease the number of the lines in the block valve system as much as possible, since a unit price per line of the block valve system is expensive.

In the structure shown in FIG. 6, on the other hand, it is impossible to fabricate a super thin film requiring a high-precision because of development of pressure and gas flow rate fluctuation in the main valve, although the block valve system includes only a small number of lines. To obtain a stable controllability relating to a film thickness of a crystal, a dummy line for stabilizing a pressure in the main gas becomes necessary to each process line, in addition to a diluting line for adjustment of the flow rate. This results in a system having a dummy line structure same as shown in FIG. 5. Hence, there will arise the same problem that it is impossible to decrease the number of the lines in the block valve system.

In consideration of these point, this invention provides a gas supplying line made up of a process line and a balance line, which balance line supplies an inactive gas such as a hydrogen gas necessary for giving a constant product of the viscosity and the flow rate to the gas supplied to the process gas line. Also such the balance lines equipped to the respective process gas lines contribute to retain the gases, running in a plurality of gas supplying lines not supplied to the growth chamber, at a constant product of the viscosity and the flow rate. Only one dummy line is required for this gas supplying group. Consequently, it is unnecessary to dispose dummy lines of [(the number of gas supplying line in a group)−1], and the number of the block valves decreases by [(the number of gas supplying lines in a group)−1]. It is therefore an object of the present invention to provide a vapor growth system, which not only enables reduction of the number of required gas supplying lines led to expensive block valves to about a half, but also enables formation of a super thin film having considerably stable crystals excellent in interfacial steepness by reducing the number of times of the valve operation to a half, thereby comprising gas supplying line system having a simplified valve structure.

DESCRIPTION OF THE INVENTION

The present invention provides a vapor growth system comprising at least one gas supplying line group comprising process gas lines for supplying process gases, balance lines for supplying flow-rate adjusting gases to the corresponding process gas lines, and a dummy line supplying a flow-rate adjusting gas, a plurality of the process gases in the process gas lines included in the same group not being supplied to the main line, simultaneously.

The present invention also provides a vapor growth method comprising the steps of adjusting a flow rate in the balance line to equalize products of the viscosity and the flow rate of a gas in a dummy line and gases in gas supplying lines, supplying a process gas required for vapor growth in the gas supplying line to a main line, and supplying a gas from the dummy line to the main line only when the process gas is not supplied from the process gas line to the main line.

In the above structure, there are provided a balance line to each gas line so that a product of the viscosity and the flow rate of the gas in each the gas line becomes constant. A pressure developed in a piping is given by:

$$\Delta P = 32 \cdot \mu \cdot L \cdot u / (g \cdot d \cdot d),$$

where d: a inner diameter of a pipe or a needle valve;
g: an acceleration of gravity;
L: a length;
$\mu$: a viscosity of a fluid; and
u: a mean velocity of the fluid.

To produce an equal pressure difference $\Delta P$ in fluids having different viscosity, the $\mu \cdot u$ needs to be equal. If a flow rate exceeds a Reynolds number $Re = d \cdot u \cdot \rho / \mu$, a pressure difference $\Delta P$ becomes:

$$\Delta P = f \cdot L \cdot \rho \cdot u \cdot u / (2 \cdot g \cdot m),$$

where f: a friction factor;
m: a hydraulic mean depth; and
$\rho$: a density of a fluid.

Figure 2:
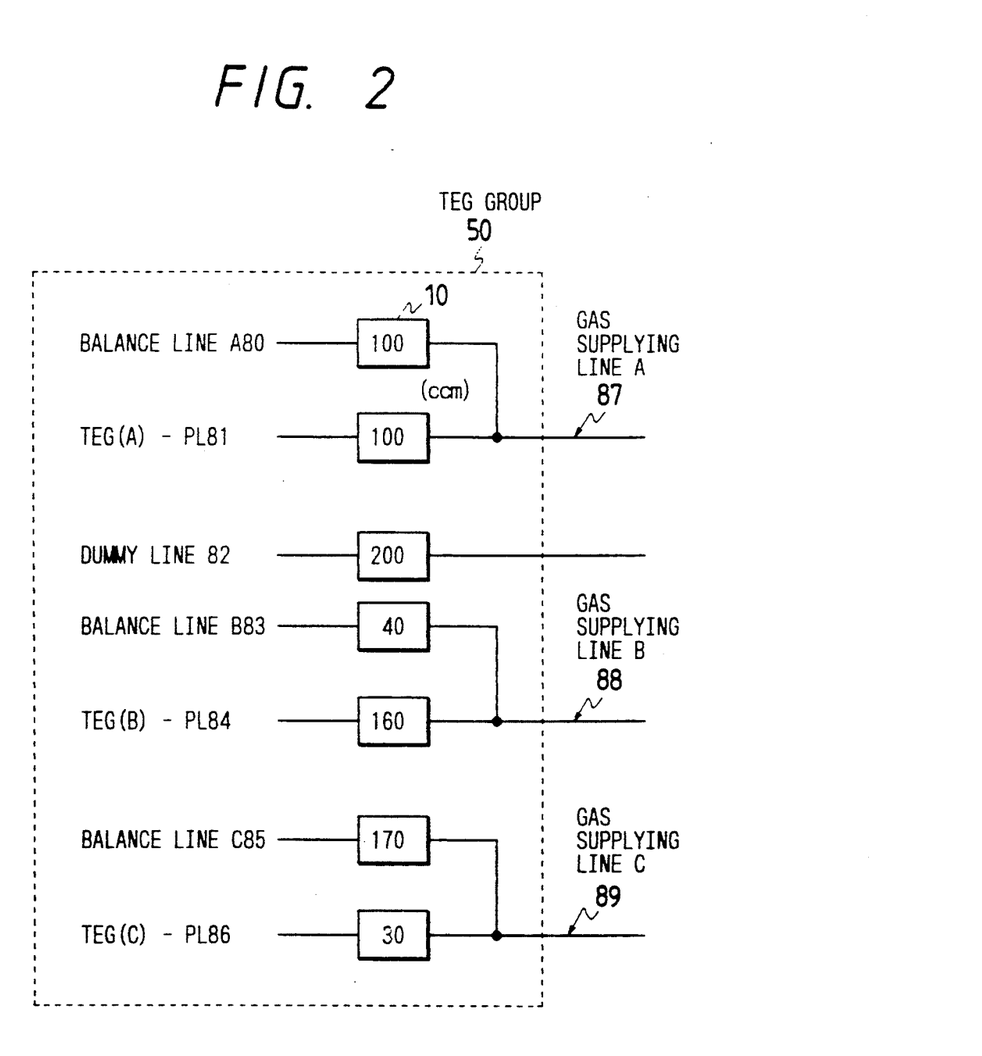
FIG. 2 is an enlarged diagram of a TEG line group in the vent-supply line system shown in FIG. 1.

Here, $f \cdot \rho \cdot u \cdot u$ is considered to be a product of the viscosity and the flow rate, for the sake of convenience. Any gas is adoptable as a gas supplied by the balance line, so long as it is inactive. Hydrogen, nitrogen or the like is suitable, for example. By virtue of the balance line, a product of the viscosity and the flow rate of a gas in the gas suppling line running into the valve system becomes constant. As an example of such the gas supplying group, there is a gas line group in which the gases have the same constituents, but are not supplied to the main line, simultaneously. FIG. 2 shows a TEG gas supplying line group 50 used for producing a quantum well structure made up of InGaAsP ($\lambda = 1.3$ $\mu$m) barrier layers 42 and InGaAs ($\lambda = 1.0$ $\mu$m) well layers 43, and an InGaAsP ($\lambda=1.0$ μm) waveguide layer 41 on a n-InP substrate 40, shown in FIG. 3. TEG gas supplying lines A81, B84 and C86 necessitate their flow rate 100, 160 and 30 ccm, respectively. These gases with three different flow rates are fed from the respective TEG bubblers through the respective mass flow controllers, of which flow rates are respectively set to 100, 160 and 30 ccm. If the quantum well layer is formed by using a mass flow controller to change a flow rate of a single process gas line, correspondingly to each of the layer, a good interfacial steepleness becomes unavailable, since an adjustment period of the order of 1 second is required until the flow rate of the mass flow controller gets stabilized, although the growth of each the layer requires approximately 10 seconds. Therefore, if the gases having flow rates of 100, 160 and 30 ccm, respectively, are supplied, dummy lines with flow rates of 100, 160 and 30 ccm are required corresponding to the respective flow rates of the gas lines. Practically, balance lines A80, B83 and C85 of 100, 40 and 170 ccm are provided to the respective TEG gas lines to mix a hydrogen gas having the respective flow rates with the TEG gases so that the mixed gas of 200 ccm is supplied to each of the gas supplying lines A87, B88 and C89, which is equal to a total value of the flow rates of the TEG gas line or a value of the balance line. In this case, gases of two different flow rate are not fed at the same time, and a hydrogen gas of 200 cc is supplied from a dummy line 82 only when the TEG gas is not supplied to the growth chamber. In production of the waveguide layer and a quantum well layer, the dummy line is not connected to the growth chamber, because the TEG gas having a suitable flow rate is changed over to be supplied for use. In the conventional system, three dummy lines are required for three TEG gas lines, thus a valve system including six lines and 12 valves becomes necessary. According to the present invention, only one dummy line is required and the number of the valves drops to $\frac{2}{3}$ of the conventional since the valve system includes only 4 lines and 8 valves, by equalizing the flow rates of the gases not used simultaneously. In particular, the number of the dummy lines provided in the gas supplying group becomes only one so that switching of the dummy line corresponding to the process lines becomes unnecessary when the vales are changed over between the two gas lines. Consequently, in the case of growth of different crystals, the number of valve switching may be reduced to a half at each crystal interface, thus pressure fluctuation in the mainline is suppressed.

Figure 1:
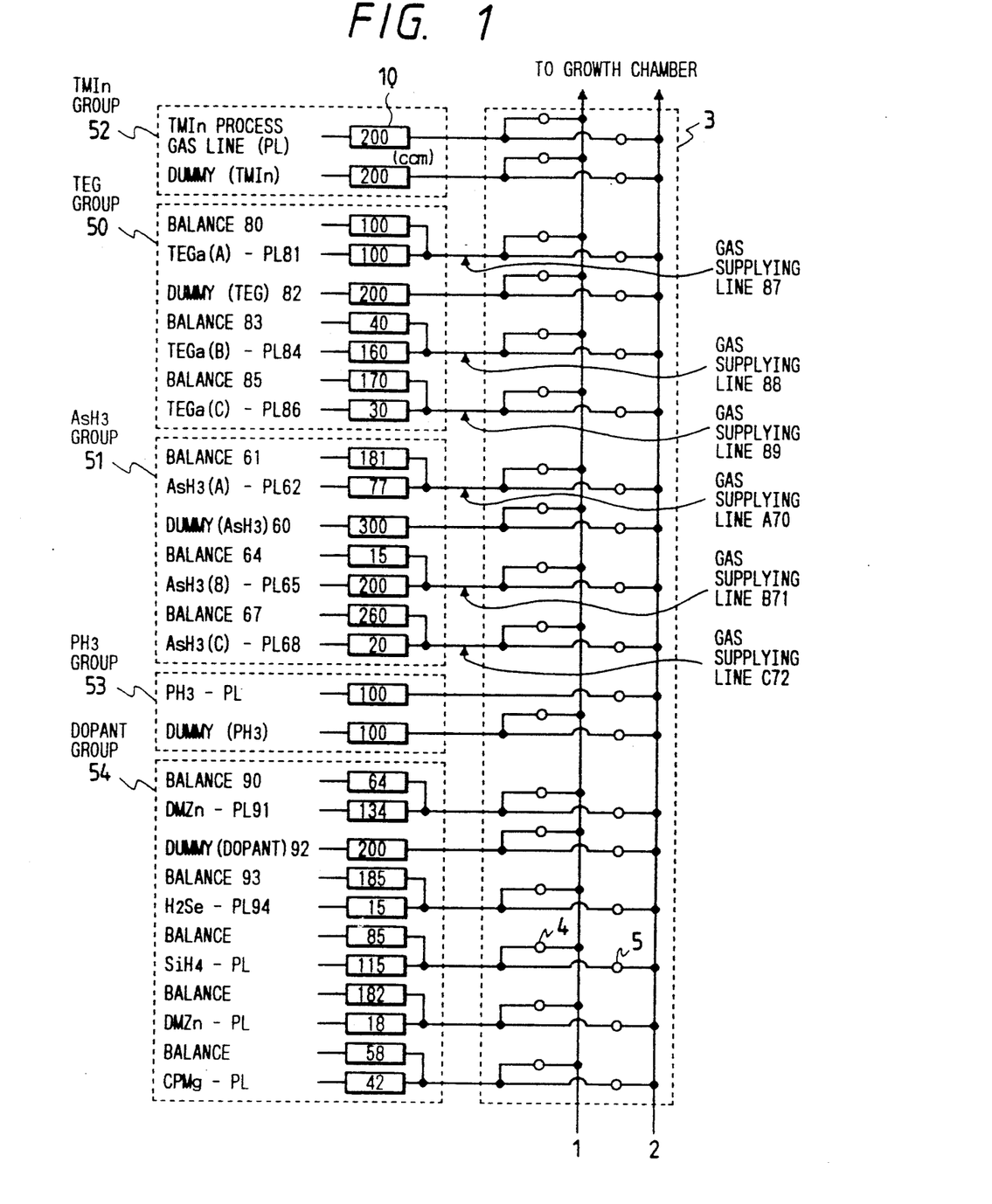
FIG. 1 is a schematic diagram showing a vent-supply line system for gases in a vapor phase crystal growth system according to an embodiment of this invention.

In a system according to the present invention, a large effect of reduction of the valve number is given to a line of dopants. As shown in FIG. 1, DMZn, DEZn, $H_2Se$, $H_2S$, $SiH_4$, CpMg and the like are utilized as dopants in an occasion of growth of InP and InGaAsP crystals. If a dummy line is provided to each of the dopant lines, six dummy lines becomes necessary so that 12 valves becomes necessary. However, if a hydrogen gas is supplied from a balance line such as to make the respective gas supplying lines for the dopants have an equal flow rate, a block valve with 7 lines including one dummy line becomes possible, besides, if the valve system is provided with a block valve, it becomes possible to utilize the remaining 5 valves in the block valve for another gas supply. As a cost of the valve block per line is about three times of that of one mass flow controller, a total cost of the block valve system including additional mass flow controllers becomes 70% of the conventional. In the above description, although the block valve system is employed for switching the valves of the gases fed to the growth chamber, the present invention is also effective when a cost of the valve is expensive compared with that of a mass flow controller.

BRIEF DESCRIPTION OF THE DRAWINGS

The above and other objects, features and advantages of the present invention will becomes more apparent from the following detailed description taken in with the accompanying drawings in which.

DETAILED DESCRIPTION OF A PREFERRED EMBODIMENT

FIG. 1 shows a gas line structure of a vapor phase crystal growth system of an embodiment according to the present invention.

In FIG. 1, numeral 1 is a main line for supplying material gases to a crystal growth chamber, while numeral 2 is a vent line for exhausting unnecessary gases for the crystal growth. Numeral 4 denotes air valves for controlling gas flow to the main line 1, while numeral 5 denotes another air valves for controlling gas flow to the vent line 2. Numeral 3 is a block valve system in which the air valves 4 and 5 are incorporated close to each other on a block-like platform. Numeral 10 denotes mass flow controllers controlling gas flows. There are also shown a TEG group 50, an $AsH_3$ group 51, a TMIn group 52, a $PH_3$ group 53 and a dopant group 54.

To grow crystals to form an InGaAs/InGaAsP MQW laser structure, a crystal growth system is required, equipped with the block valve system connected to the $AsH_3$ group, $PH_3$ group, TEG (triethylgarium) group, the TMI (trimethylindium) group and the dopant group. Namely, there are an $AsH_3$ group, a $PH_3$ group, a TEG group and a TMI group, gases included in the respective groups have different flow rates and are not fed to the main line, simultaneously. There are also various dopant groups, since a P-type dopant and a N-type dopant are not doped at the same time. These process gases such as TEGa and the like are mixed and adjusted by balance lines so as to have the same flow rate as the another supplied gases included in the same group. As a result, to continuously grow different kinds of crystals, gases having required concentrations for the respective crystals are supplied through valve switching between gas supplying lines of the gases. In this case, it is unneccesary to change over to a valve of a dummy line for adjustment of the flow rate, since a product of the viscosity and the flow rate in a supplying line is equalized to the another supplying lines. The dummy line is effectively connected to the main line only when a crystal not made from the gas in the main line is grown so that pressure fluctuation in the main line may be prevented.

Hereinafter, an explanation will be made of the gas supplying group 51 for supplying the $AsH_3$ gas, representatively, which gas with a tendency to bring about pressure fluctuation due to a larger viscosity than those of another supplied gas groups causes difficulty in attainment of a good interface in the conventional method.

Figure 4:
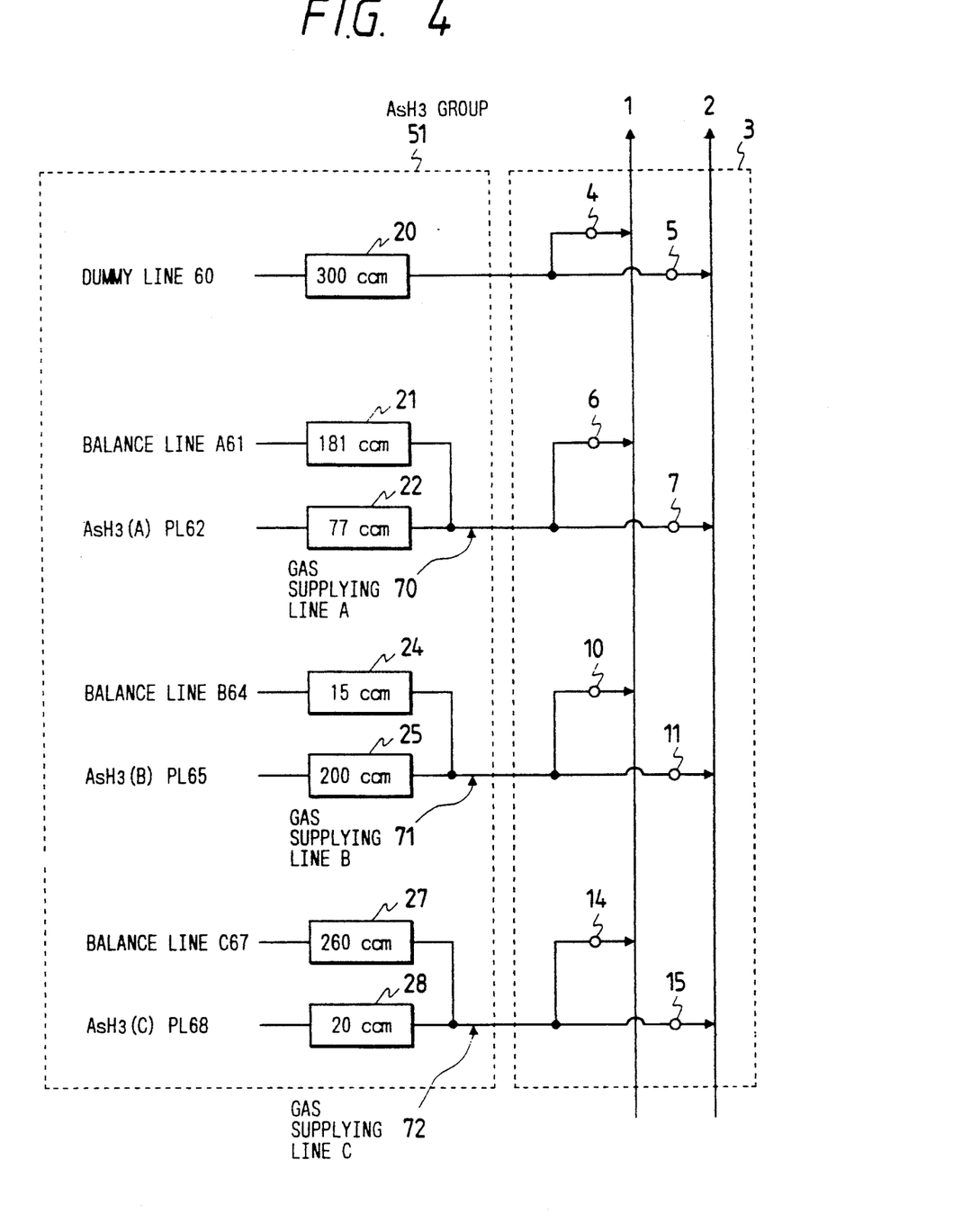
FIG. 4 is an enlarged diagram of an $AsH_3$ group in the vent-supply line system shown in FIG. 1.

The $AsH_3$ group 51 consists of a balance line A61, an $AsH_3$ (A) process line 62 (hereinafter abbreviated as PL), a dummy line 60, a balance line B64, an $AsH_3$ (B) PL65, a balance line C67, and an $AsH_3$ (C) PL68. The balance line A61 together with the $AsH_3$ (A) PL62 forms a gas supplying line A70, the balance line B64 together with the $AsH_3$ (B) PL65 forms a gas supplying line B71, and the balance line C67 together with the $AsH_3$ (C) PL68 forms a gas supplying line C72.

As shown in FIG. 4, the flow rates of the mass flow controllers 20, 21, 22, 24, 25, 27 and 28 are set to 300, 181, 77, 15, 200, 260 and 20 ccm, respectively.

Hereinafter will be illustrated an operation relating to the gas flow in the $AsH_3$ group 51. Now, 77 ccm of a 20% $AsH_3$ gas diluted with hydrogen supplied from a cylinder is fed to the $AsH_3$ (A) PL62 and 181 ccm of a hydrogen gas is fed to the balance line A61. These gases are mixed in the supplying line A70. Similarly, 200 ccm of a 20% $AsH_3$ gas is fed to the $AsH_3$ (B) PL65, and 15 ccm of a hydrogen gas is fed to the balance line B64. These gases are mixed in the gas supplying line B71. 20 ccm of a 10% of $AsH_3$ gas is fed to the $AsH_3$ (C) PL68, and 260 ccm of a hydrogen gas is fed to the balance line C67. These gases are mixed in the gas supplying line C72. The flow rates in the balance lines A61, B64 and C67 are set so as to give an equal product of the viscosity and the flow rate to the gas supplying lines A70, B71 and C72, and the dummy line 60.

Now, a reason why the $AsH_3$ (A) 62, $AsH_3$ (B) 65 and $AsH_3$ (C) 68 are respectively set to three different flow rates will be described. In the case of a continuous growth of crystals with different compositions, if one process line is installed and its flow rate thereof is altered according to the composition of the grown crystal, there will be necessitate a considerable time until the flow rate in a mass flow controller get stabilized. This will further result in an inferior interfacial steepleness. Conseq ently, crystals excellent in interfacial steepleness may be obtained by providing independent lines which are set different flow rates necessary for the respective crystals and by switching the lines at the time of a start of forming a crystal different from the preceding, simultaneously.

Now will be described a valve controlling method for forming a laser structure shown in FIG. 3, referring to FIG. 7. It is necessary to change the flow rates of the TEGa and $AsH_3$ correspondingly to the respective crystals in order to form a quantum well structure comprising a well layer 43 and a barrier layer 42. In particular, a controlling method of the valves in the $AsH_3$ will be here described, in detail.

Figure 3:
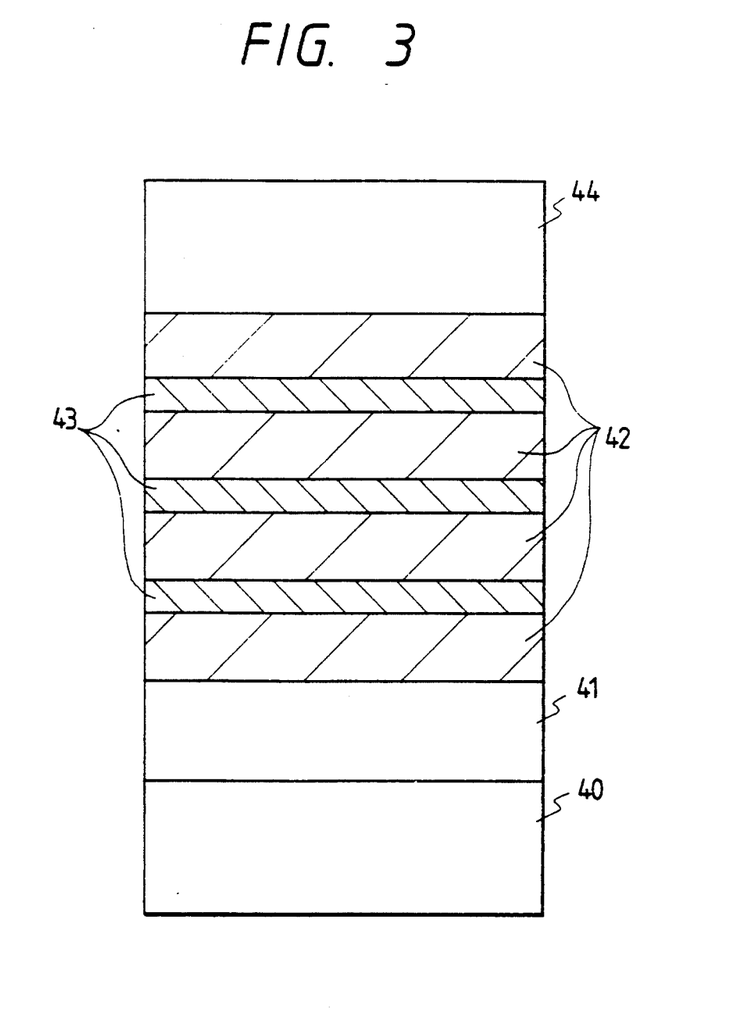
FIG. 3 shows a laser structure produced by using the vapor phase crystal growth system according to the embodiment.

FIG. 3 shows a laser structure including a n-InGaAsP ($\lambda=1.0$ $\mu$m) waveguide layer 41, a quantum well structure made up of InGaAsP ($\lambda=1.3$ $\mu$m) barrier layers 42 and InGaAs well layers 43, and a p-InP cladding layer 44, on an InP single crystal substrate 40.

Detailed descriptions will be hereinafter made of control of the $AsH_3$ gas upon crystal growth to form the laser structure set forth above. The $AsH_3$ gases having different compositions are required when the waveguide layer 41, the barrier layer 42 and the well layer 43 are successively formed. The control of the $AsH_3$ is performed upon production of the quantum well structure comprising the InGaAsP ($\lambda=1.3$ $\mu$m) barrier layer 42 and the InGaAs well layer 43, as follows. As particularly shown in FIG. 4, 20 ccm of a 10% $AsH_3$ gas is required as a process gas C when growing the InGaAsP waveguide layer 41, 77 ccm of a 20% $AsH_3$ is required as a process gas A when growing the InGaAsP barrier layer 42, and 200 ccm of a 20% $AsH_3$ is required as a process gas A when growing the InGaAs well layer 43. The respective gases are supplied in order for 8 minutes and 34 seconds, for 20 seconds and for 8 seconds, respectively, when thickness of the layers are respectively determined to 150, 10 and 6 nm. If the flow rate is changed in a single process line using a single mass flow controller, a time period of the order of 2 seconds is required until the flow rate becomes stable. This time period is comparable to an accumulating time of five atomic layers so that the steepleness of the interface becomes deteriorated. It is, accordingly, necessary to set three different flow rates to the process lines A, B and C for the $AsH_3$. That is, the gas A corresponds to 77 ccm of a 20% $AsH_3$, the gas B to 200 ccm of a 20% $AsH_3$ and the gas C to 20 ccm of a 10% $AsH_3$, as described before.

In order to make products of the viscosity and the flow rate in the gas supplying lines A70, B71 and C72 constant, flow rates of hydrogen gases in the balance lines A61, B64 and C67 are set to 181, 15 and 260 ccm, respectively. A total of the flow rates of the mixed gases are calculated 258, 215 and 280 ccm, respectively. At this time, a flow rate of the hydrogen gas in the dummy line is set to 300 ccm. A reason why the flow rate of the mixed gases differs from that of the dummy line is that the $AsH_3$ is viscous. This viscosity of the gas largely affects when a gas, such as $PH_3$ or $AsH_3$, of a flow rate exceeding 10 ccm and a high concentration is flowed. For this reason, a 100% $PH_3$ becomes about 179 ccm for a 300 ccm dummy line.

Figure 7:
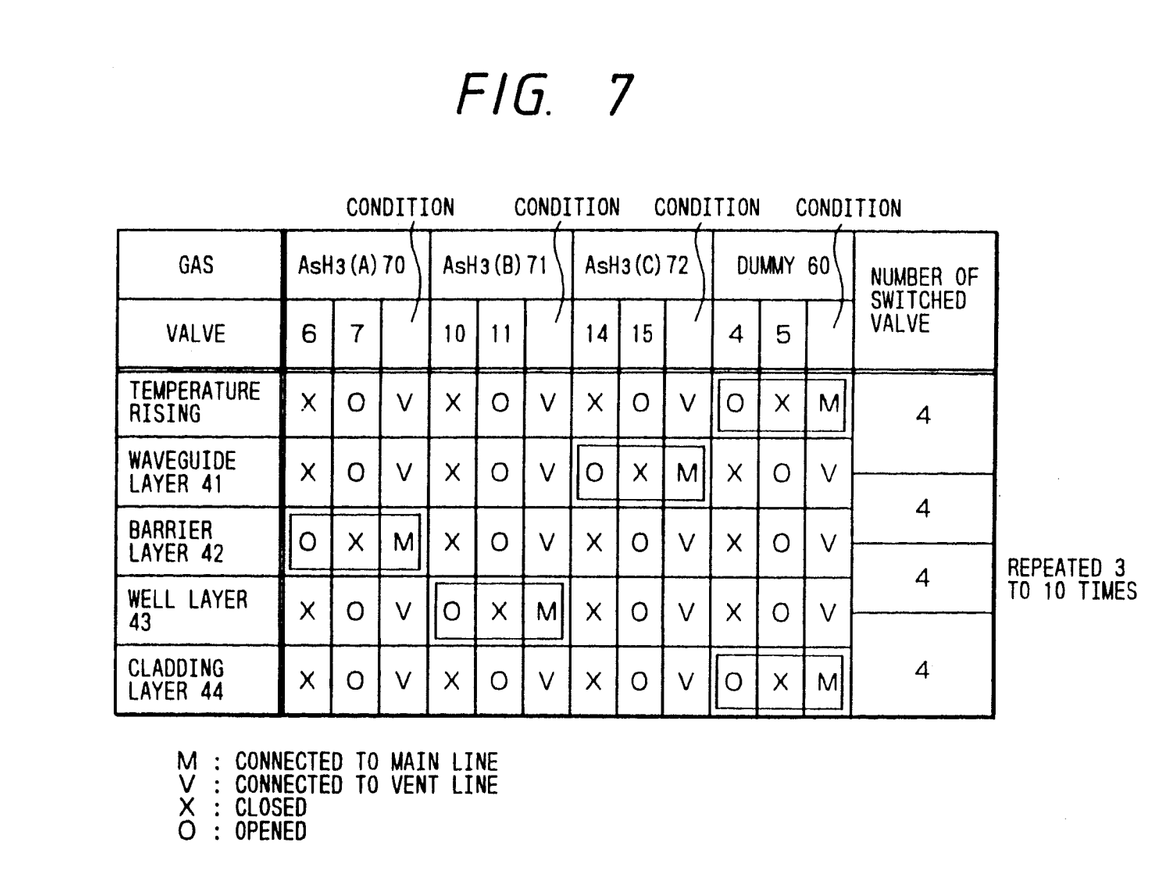
FIG. 7 shows a sequence of valve switching in the vapor phase crystal growth system according to the embodiment.

FIG. 7 shows switching of the valves. When increasing the temperature of the substrate prior to the growth of the waveguide layer, only the $PH_3$ is fed. At this time, the main line is supplied hydrogen from the dummy line 60 since the $AsH_3$ is unnecessary. The gas supplying lines A70, B71 and C72 are connected to the vent line. The valves 4, 7, 11 and 15 are opened, while the valves 5, 6, 10 and 14 are closed. After increasing the temperature, the waveguide layer 41 is formed. At that time, the dummy line is required to be connected to the vent line, besides the line C72 is connected to the main line. That is, the valves 4 and 15 are closed and, simultaneously, the valves 5 and 14 are opened. Next, the barrier layer is formed. The gas supplying line C72 is required to be connected to the vent line, besides the gas supplying line A70 is connected to the main line. That is, the valves 7 and 14 are closed and, simultaneously, the valves 6 and 15 are opened. Next, the well layer 43 is formed. The gas supplying line A 70 is connected to the vent line, while the gas supplying line B71 is connected to the main line. The valves 6 and 11 are closed and, simultaneously, the valves 7 and 10 are opened. Thereafter, switching between the line A and the line B are repeated ten-odd times until the growth of the quantum well structure is completed. In the above operation, there is no difference among products of the viscosity and the flow rate of the gases supplied to both the main line and the vent line so that pressure fluctuation in the main line due to the switching of the valves will be hardly occurred.

In the dopant group 54, supply of hydrogen from a balance line gives an effect similar to a diluting line, if a flow rate of a supplied gas such as $H_2Se$ 94, which is a doping gas, is extremely small, for example, 15 ccm. As a doping gas, 134 ccm of a 200 ppm DMZn gas is fed to a gas supplying line A91, 64 ccm of a hydrogen gas being supplied to a balance line 90. From the dummy line 92, 200 ccm of a 100% hydrogen gas is supplied. A total flow rate of the DMZn and the hydrogen gases for the balancing becomes 198 ccm. This is a value of the flow rate which has been reduced a value of a flow rate corresponding to a pressure developed by a resistance of flow of the DMZn gas in the main line because of its viscosity. To the gas supplying line B94, 15 ccm of a 100 ppm $H_2Se$ gas is supplied, while 185 ccm of a hydrogen gas is supplied to the balance line 93. When the n-InGaAsP layer doped $H_2Se$ is formed after the thermal treatment of the n-InP substrate, the flow rate of the $PH_3$ gas is, largely, changed from 300 ccm to 100 ccm. At this time, the flow rate of the gas in the main line is fluctuated in a slight degree during a time period from 0.05 to 0.07 second, which is required for the switching of the gases. As a result, there is a possibility of backflow of the gas from the main line if installing a single line for $H_2Se$ with a small flow rate in the system. Such the backflow may be prevented by setting a flow rate 185 ccm to the balance line similar to the another doping gas lines so that a flow rate of the gas supplied to the main line becomes 200 ccm, in total.

Figure 8:
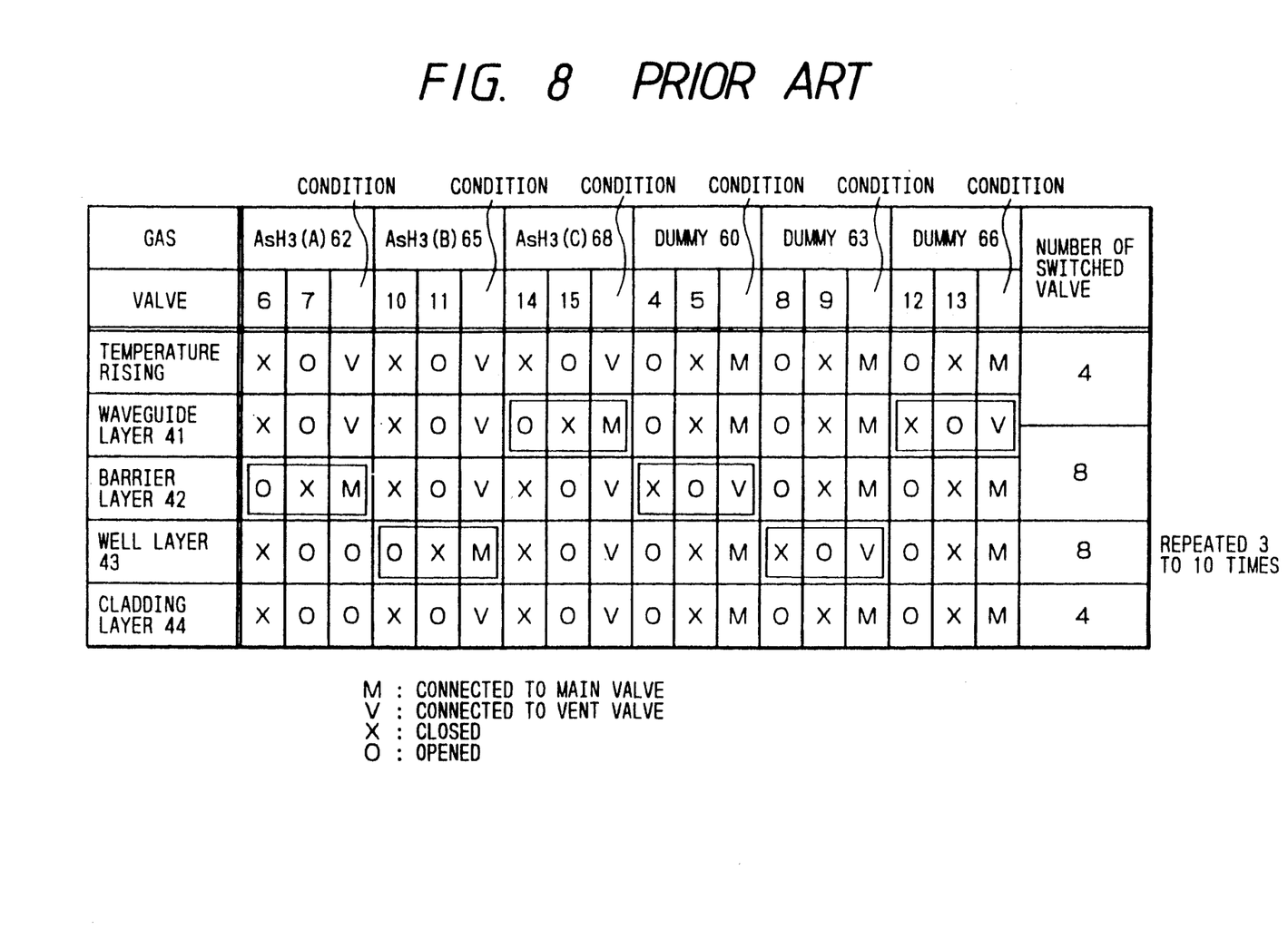
FIG. 8 shows a sequence of valve switching in the conventional vapor phase crystal growth system.

FIG. 8 shows a sequence of switching of the valves in the conventional system shown in FIG. 5. It can be seen from FIG. 8, the number of times of the valve operation according to the present invention may be reduced to a half comparing with the conventional system, during the repeating growth of the barrier layers 42 and well layers 43 reaching ten-odd times, where an importance is given, particularly, to the interfacial steepness.

In the above description, the main line 1 and the vent line 2 is in a reduced pressure, a 200 Torr, and the growing chamber is in a reduced pressure of 70 Torr. As a result, the pressure fluctuation in the main line and the vent line decreases from 10 to 2 Torr or less, and the interfacial steepness of the crystals is reduced from 1.5 nm to 0.5 nm or less.

According to this embodiment, the balance lines are provided to the respective gas supplying lines to equalize products of the viscosity and the flow rate in the supplying gas lines, in which process gases are not fed simultaneously, and a single dummy line is equipped although it has been required to the each process line in the convention system, whereby the number of valves may be decreased and the crystal properties and the interfacial steepness may be improved.

Although the above description has been made by way of the $AsH_3$ gas line group, mainly, any process gas group is adoptable so long as it includes process gases not fed simultaneously. Also, the present invention is adoptable to another vapor-phase growth of a crystal, such as GaAs's, another chemical compound semiconductors, oxides, insulating films, deposition and the like, in addition to InP's. Other than hydrogen supplied to the balance and dummy lines in this embodiment, another inactive gas may be adopted. Moreover, although the block valve system is used as switching valves for the gases supplied to the growth chamber in this embodiment, general valves or valves having another structure may be employed. Furthermore, organometallic gases are used in this embodiment, another process gases for manufacturing semiconductors and superconductive material such as hydride, silane, and the like can be used.

As readily understood from the above description, the present invention may provide a vapor growth system, which enables formation of a super thin film with an excellent interfacial steepness by reducing the number of the time of valve switching during the formation of the films. In addition, attainment of reduction of the number of required lines in the expensive valve system realizes a low-cost system with a simplified structure, thus bringing noticeable advantages, in practise.

What is claimed is:

1. A vapor growth method comprising the steps of:
   adjusting a flow rate in a balance line to equalize products of the viscosity and the flow rate of a gas in a dummy line and gases in gas supplying lines;
   supplying a process gas required for vapor growth in a gas supplying line to a main line; and
   supplying a gas from the dummy line to the main line only when the process gas is not supplied from the process gas line to the main line.

* * * * *